(12) United States Patent
Liufu et al.

(10) Patent No.: US 8,703,040 B2
(45) Date of Patent: Apr. 22, 2014

(54) METHOD FOR MANUFACTURING A PIEZOELECTRIC CERAMIC BODY

(75) Inventors: De Liufu, Palm Beach Gardens, FL (US); Louis Regniere, Cary, NC (US)

(73) Assignee: Sonavation, Inc., Palm Beach Gardens, FL (US)

( * ) Notice: Subject to any disclaimer, the term of this patent is extended or adjusted under 35 U.S.C. 154(b) by 429 days.

(21) Appl. No.: 12/819,518

(22) Filed: Jun. 21, 2010

(65) Prior Publication Data

US 2011/0010904 A1 Jan. 20, 2011

Related U.S. Application Data

(60) Provisional application No. 61/218,690, filed on Jun. 19, 2009.

(51) Int. Cl.
*C04B 35/491* (2006.01)

(52) U.S. Cl.
USPC .......................................................... 264/614

(58) Field of Classification Search
USPC .................. 264/642, 645, 614–620
See application file for complete search history.

(56) References Cited

U.S. PATENT DOCUMENTS

| | | | |
|---|---|---|---|
| 5,340,510 | A | 8/1994 | Bowen |
| 5,548,564 | A | 8/1996 | Smith |
| 5,968,290 | A * | 10/1999 | Sakurada et al. ............. 148/302 |
| 7,132,057 | B2 * | 11/2006 | Liufu .................... 252/62.9 PZ |
| 2001/0050514 | A1 | 12/2001 | Gururaja |
| 2005/0156362 | A1 | 7/2005 | Arnold et al. |
| 2005/0203231 | A1 | 9/2005 | Halpert et al. |
| 2007/0038111 | A1 | 2/2007 | Rehrig et al. |
| 2007/0181846 | A1 * | 8/2007 | Liufu ..................... 252/62.9 PZ |
| 2009/0159833 | A1 * | 6/2009 | Liufu ..................... 252/62.9 PZ |
| 2010/0239751 | A1 * | 9/2010 | Regniere ....................... 427/100 |
| 2011/0003522 | A1 * | 1/2011 | Chen et al. ...................... 442/59 |
| 2011/0204277 | A1 * | 8/2011 | Liufu ..................... 252/62.9 PZ |
| 2011/0306726 | A1 * | 12/2011 | Bailey et al. .................. 524/598 |

FOREIGN PATENT DOCUMENTS

| | | |
|---|---|---|
| CN | 101028979 | 9/2007 |
| JP | 2005286444 | 10/2005 |

OTHER PUBLICATIONS

International Search Report for International Application No. PCT/US 10/01778, United States Patent and Trademark Office, U.S.A., mailed on Sep. 15, 2010.

(Continued)

*Primary Examiner* — Joseph S Del Sole
*Assistant Examiner* — Russell Kemmerle, III
(74) *Attorney, Agent, or Firm* — Kenneth J. Lukacher Law Group

(57) ABSTRACT

The present invention relates to a method of manufacturing a piezoelectric ceramic body and devices therefrom. The method comprises mixing a piezoelectric ceramic powder with a polymer binder and surfactant to form a slip mixture, casting the slip mixture into a mold and setting to the slip mixture in the mold to form a green body, cutting the green body to form a cut green body with an array of micron-sized ceramic elements and separation, and sintering the cut green body to form a sintered ceramic body. The sintered ceramic body can be further process to encasing in a polymer material to form a piezoelectric ceramic-polymer composite. The piezoelectric ceramic-polymer composite can be further processed to form devices such as acoustic transducers and sensors.

30 Claims, 9 Drawing Sheets

(56) References Cited

OTHER PUBLICATIONS

The Written Opinion of the International Searching Authority for International Application No. PCT/US 10/01778, United States Patent and Trademark Office, U.S.A., mailed on Sep. 15, 2010.

State Intellectual Property Office of the People's Republic of China, Application No. 201080032563.9, Notification of the First Office Action dated Oct. 10, 2013.

European Patent Office, Application No. 10789879.3, Extended European Search Report dated Sep. 6, 2013.

* cited by examiner

METHOD FOR MANUFACTURING A PIEZOELECTRIC CERAMIC BODY

CROSS-REFERENCE TO RELATED APPLICATIONS

This application claims benefit to U.S. Provisional Application No. 61/218,690, filed on Jun. 19, 2009, which is incorporated by reference herein in its entirety.

BACKGROUND OF THE INVENTION

1. Field of the Invention

The present invention relates to a method of manufacturing piezoelectric ceramic composites for devices, for example transducers and sensors. More particularly, the present invention relates to a method for manufacturing a piezoelectric ceramic body for piezoelectric ceramic-polymer composites.

2. Background Art

Piezoelectric composites have been used, with increasing frequency, in acoustic transducers for ultrasonic imaging, biometrics, and non-destructive testing (NDT). Typically, the acoustically active element in such transducers is made from piezoelectric ceramic materials. However, market demand for large array acoustic transducers has been inhibited by the high costs involved in manufacturing the piezoelectric composites. The high cost is largely due to difficulties in the manufacturing processes associated with fabricating the ceramic bodies for the transducers.

The most common fabrication method for manufacturing piezoelectric composites for transducers is the dice and fill (D&F) method. In the D&F method, a wafer saw is used to cut a grid of rectangular or rhombic shaped kerfs into a sintered piezoelectric ceramic body without cutting all the way through (i.e. leaving a solid material base). The kerfs are then filled with a polymer; a process known as encapsulation. This method produces a matrix of ceramic pillars surrounded by a polymer fill. Further processing to fabricate a transducer or sensor continues by grinding away any unslotted sections of the ceramic body, electroplating the surfaces of exposed ceramics, machining to shape and poling.

However, the D&F method has several limitations. One such limitation is that the D&F method costs about $100-$200 per square inch depending on the frequency and associated pillar pitch of the transducer. Additionally, due to the hardness of the piezoelectric sintered ceramic body, the processing time is consuming; can only dice at a speed of about 3 mm/sec to 5 mm/sec. Further, dicing utilizes thin diamond coated blades to slot (cut) the ceramic body. The blades are expensive, have short usage lives, and are difficult to change.

What is needed, therefore, is a more efficient and lower cost method for reliably manufacturing piezoelectric ceramic bodies for fabricating piezoelectric composites for large array acoustic transducers and sensors. Also needed is a method and/or system to improve shrinkage control and reduce warpage. Controlling shrinkage allows for more efficient processing of a sintered ceramic body for fabrication of transducers and sensors.

BRIEF SUMMARY OF THE INVENTION

The present invention provides an improved method of manufacturing piezoelectric composites. In one embodiment, the present invention includes a method of manufacturing a piezoelectric ceramic body comprising mixing a ceramic powder, polymer binder and surfactant to form a slip mixture with a solids loading by weight; casting said slip mixture into a mold; setting the slip mixture in said mold to form a green body separating said green body from said mold; cutting said green body to form a cut green body with an array comprising a plurality of micron-size ceramic elements and separations; and sintering said cut green body to form a densified sintered body.

In accordance with another aspect of the present invention, the sintered ceramic body is further processed to form a piezoelectric ceramic-polymer composite by encapsulating the sintered ceramic body in a polymer material.

In another embodiment, the present invention includes a method of manufacturing a piezoelectric composite comprising mixing a piezoelectric ceramic powder, organic binder, and surfactant to form a slip wherein said slip has a solids loading of at least 90% by weight; casting said slip into a mold to form a green body; separating said green body from said mold; cutting said green body to form a cut green body with an array of micron-sized ceramic elements and separations; bisquing said cut green body to burn out said polymer binder; sintering said cut green body to form a sintered ceramic body; and encasing said sintered ceramic body in a polymer material to form a piezoelectric ceramic-polymer composite.

In accordance with another aspect of the present invention, the piezoelectric composite is further processed to form a device, such as an acoustic transducer or sensor.

In an alternative embodiment, the present invention includes a method of manufacturing a net-shaped piezoelectric composite comprising mixing a piezoelectric ceramic powder, organic binder, and surfactant, and an optional dispersant to form a slip mixture wherein said slip has a solids loading of at least 90% by weight; injecting the slip into a mold to form a net-shaped green body with an array of micron-sized ceramic elements and separations; separating said green body from said mold; bisquing said green body to burn out the binder; sintering said green body to form a sintered ceramic body; and encasing said sintered ceramic body in a polymer material to form a piezoelectric ceramic-polymer composite Further embodiments, features, and advantages of the present invention, as well as the structure and operation of the various embodiments of the present invention, are described in detail below with reference to the accompanying drawings.

It is to be understood that both the foregoing general description and the following detailed description are exemplary and explanatory only, and are not restrictive of the invention as claimed.

BRIEF DESCRIPTION OF THE DRAWINGS/FIGURES

The accompanying figures, which are incorporated herein and form part of the specification, illustrate a cast and dice method of manufacturing a piezoelectric ceramic body and more particularly a method of manufacturing a piezoelectric ceramic composites for transducers and sensors. Together with the description, the figures further serve to explain the principles of the cast and dice method of manufacturing a piezoelectric ceramic body described herein and thereby enable a person skilled in the pertinent art to make and use the a piezoelectric ceramic body in accordance with the cast and dice method of manufacturing.

FIG. 9B shows an illustration of an array with uniform rectangular micron-sized ceramic elements in a net-shaped ceramic body.

DETAILED DESCRIPTION OF THE INVENTION

Figure 1:
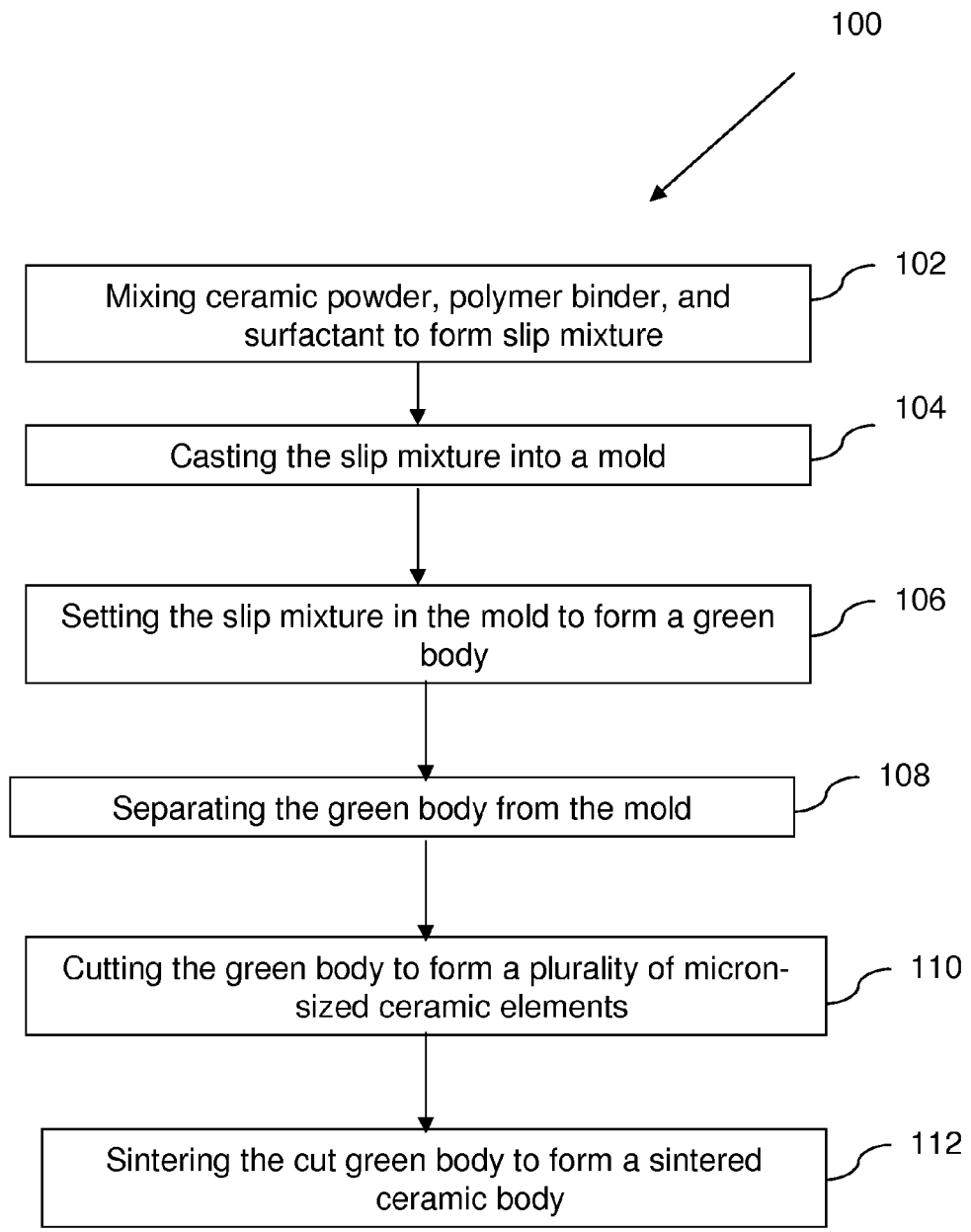
FIG. 1 shows a flowchart showing example steps for manufacturing a sintered ceramic body according to an embodiment of the present invention.

Reference will now be made in detail to embodiments of the present invention with reference to the accompanying figures, in which like reference numerals indicate like elements.

"Slip mixture" is used herein to refer to the composition comprising the ceramic powder that can be molded to form a molded slip mixture. "Green body" is used herein to mean the molded article that results from molding and setting the slip mixture. "Cut green body" is used herein to refer to the product of cutting/dicing a green body to form an array of a plurality of ceramic elements. "Sintered ceramic body" is used herein to refer to the product of sintering a green body.

In one embodiment, the present invention relates to a method of manufacturing a ceramic body, comprising the steps of mixing a ceramic powder, polymer binder, and surfactant to form a slip mixture; casting the slip into a mold and setting to form a ceramic green body; separating the green body from the mold; cutting (dicing) the green body to form an array of micron-sized ceramic elements (pillars) and micron-sized gaps/separations between the elements; and sintering the cut green body to form a sintered ceramic body.

For example, FIG. 1 is an illustration of a flowchart 100 showing example steps for producing a sintered ceramic body. In step 102, a ceramic powder, polymer binder, a surfactant and optionally dispersant are mixed to form a slip mixture. In another embodiment, the ceramic powder can be optionally milled (ground with a grinding medium) prior to forming the slip to have a preferred particular particle size and/or size distribution.

In step 104, the slip mixture is cast into a mold and set, step 106, in the mold to form a green body. In step 108, the green body is separated (i.e., removed) from the mold so it can be cut or diced to form an array of micron-sized ceramic element with micron-sized separations (kerfs) between the elements in step 110. In step 112, the cut green body is heated (sintered) to burn out the binder and densify the body to form a sintered ceramic body.

In another embodiment of the present invention, the sintered ceramic body can be further processed to form a piezoelectric composite by encasing the sintered ceramic body in a polymer material. In a further embodiment, the piezoelectric composite can be processed to form a device such as a transducer or sensor.

Figure 2:
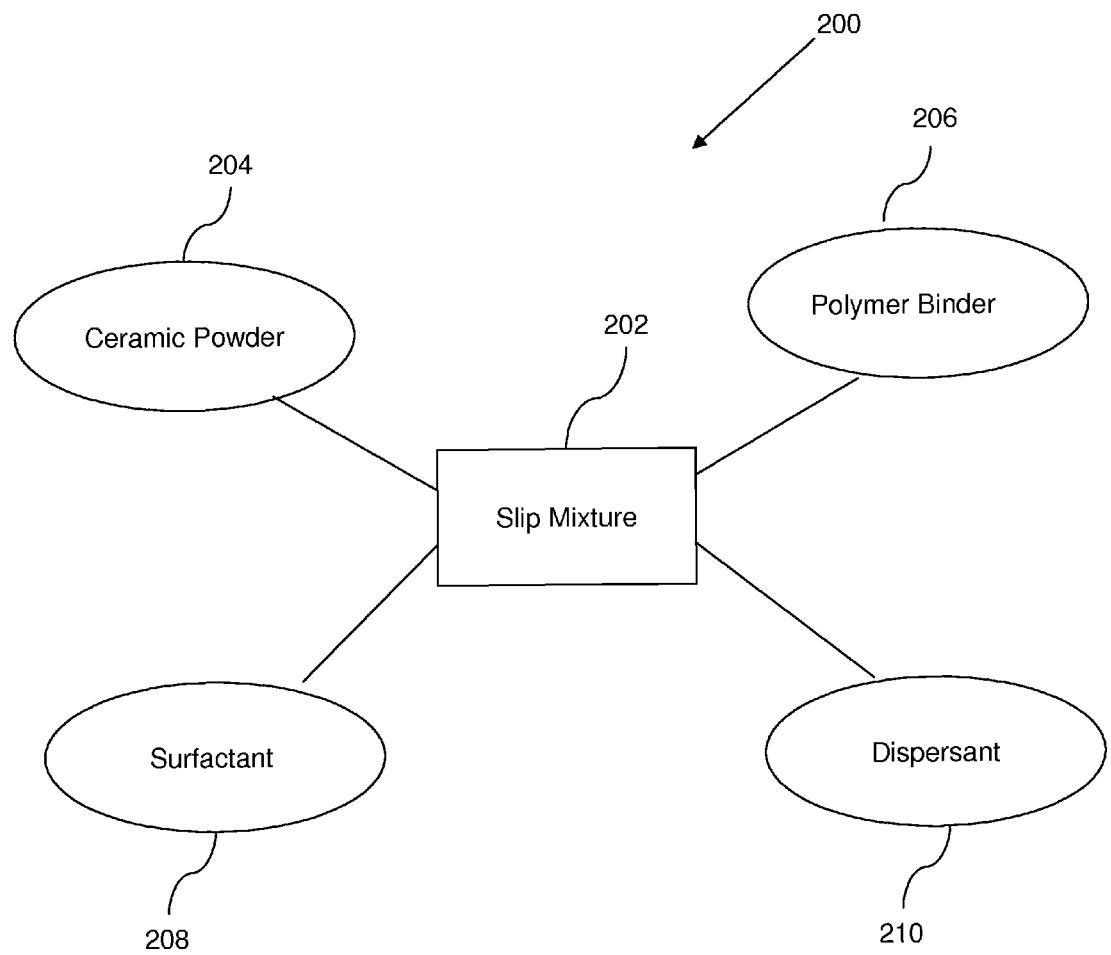
FIG. 2 shows a diagram of a slip mixture according to an embodiment of the present invention.

FIG. 2 is an illustration of a diagram 200, of slip mixture 202. Slip mixture 202 comprises ceramic powder 204, polymer binder 206, surfactant 208, and optionally dispersant 210.

The ceramic powder for use in the present invention can be any piezoelectric or electrostrictive ceramic powder. Such materials are well known in the art and are commercially available. Specific examples include but are not limited to barium titanate, lead titanate, lead zirconate, lead zirconate titanate (PZT), lead niobium titanate (PNT), lead scandium niobium titanate, and any other suitable piezoelectric or electrostrictive ceramic powder known to one skilled in the art. A preferred material for use in the present invention is PZT.

The commercially available ceramic powder can optionally be further processed to a desired form, such as that form having a defined particle size and/or size distribution. Controlling the particle size and size distribution is important for controlling shrinkage of the sintered ceramic body. Grinding the ceramic powder to a desired particle size and size distribution improves shrinkage control to avoid cracking of the ceramic body and also allows for increasing the density of the green body by having a high solids loading in slip mixture 202. Increasing the density of the green body provides improved mechanical strength for dicing and leads to a reduction in the amount of shrinkage during setting and sintering.

In a preferred embodiment, the ceramic powder will have a particle size ranging from 0.2 μm to 1.6 μm. In a preferred embodiment; example particle size distributions are shown in Table 1:

TABLE 1

| Preferred Particle Size Distribution | |
|---|---|
| D 10 | 0.2 μm to 0.5 μm |
| D 50 | 0.7 μm to .9 μm |
| D 90 | 1.3 μm to 1.6 μm |

The ceramic powder can be ground or sheared into its desired particle size/size distribution neat, or alternatively as a mixture comprising the ceramic powder and other materials. For example, the ceramic powder can be ground with a grinding medium to produce the desired particle size and/or size distribution. Contamination of the ceramic powder should be prevented. A preferred grinding media to prevent contamination is zirconia or beta zirconia. Other suitable grinding media include alumina, stainless steel, or any other suitable grinding media that would limit contamination of the ceramic powder to less than 0.02% impurities. In a preferred embodiment, ceramic powder 204 is ground for 5 hours with a zirconia grinding medium to obtain the preferred particle size and preferred particle size distribution.

The amount of ceramic powder in slip mixture 202 can vary depending on the desired final properties of the slip mixture, the green body, and the sintered ceramic body. Increasing the amount of ceramic powder in the slip reduces the sinter shrinkage and may increase the density of the resulting sintered ceramic body. More dense bodies have better physical and mechanical properties, such as mechanical strength. However, the processability of the slip is adversely affected as the volume and/or weight fraction of ceramic powder increases. Specifically, the slip becomes more powdery and less pourable.

Slip mixtures of the present invention, however, comprise a high volume percent (vol. %) and or weight percent (wt. %) of ceramic powder, resulting in dense ceramic bodies, without using excess liquids or solvents to render the slip pourable. The high solids loading of ceramic powder 204 in slip mixture 202 reduces shrinkage and increases the density so a green body can be obtained that is substantially the same size and shape as the mold (i.e. there is negligible shrinkage during the setting step). For example, the slip 202 has a high solids loading such that slip mixture 202 can comprise about 85-98 wt. % ceramic powder. In a preferred embodiment, the slip comprises about 90 wt. % ceramic powder. Alternatively, slip mixture 202 comprises about 98 vol. % ceramic powder.

Slip mixture 202 of the present invention comprises low wt. % of polymer binder. For example, the slip can comprise 1-10 wt % polymer binder. In a preferred embodiment, the slip comprises about 9.8 wt % polymer binder, surfactant, and optional dispersant.

Polymers for use in the present invention include any polymers that bind the ceramic powders and form slip mixtures having viscosities low enough to be flowable, pourable, or injectable. Preferably, the polymers will have a viscosity under 400 cPs at 25° C. The term "polymer" includes polymer precursors, pre-polymers, and uncrosslinked polymers mixed with cross-linking agents. In one example, the polymer is a thermosetting polymer. Particular examples of polymers include, but are not limited to, polyesters, polyurethanes, silicone rubbers and epoxy polymers. A preferred polymer is low viscosity epoxy polymer resin. Unlike typical binders, such as polyvinyl alcohol (PVA) and polyvinyl butyral (PVB), an epoxy polymer resin provides sufficient mechanical strength so that the green body may be cut/diced without destruction. However epoxy polymers are not as easily burned out. Controlling temperature during binder burn out is critical to removing all the binder while not causing distortion or cracking of the green body. In one embodiment of the present invention, a slow bisquing treatment over a two to three day period is used to more easily remove the epoxy polymer resin.

The phrase "epoxy polymer" is used herein to refer to uncured epoxy precursors, mixed epoxy precursors and the finished, cured or cross-linked epoxy polymer. Examples of epoxy polymers suitable for use in the present invention include, but are not limited to, two-part epoxy precursors, three-part epoxy precursors, or epoxy precursors having more than three parts. One example of a two part epoxy precursor includes, but is not limited to, a precursor having two or more amine functional groups and another part having two or more epoxide functional groups. Epoxy resins are well known to one of ordinary skill in the art. Specific examples of epoxy polymers include D.E.R. 300 and 600 series epoxy resins (available from Dow Chemicals, Inc.) and the polymer that results from a first part RBC-3200 A epoxy resin and a second hardener part RBC-3200 A120 (available from RBC Industries, Inc.) or Epo-Tek 301-2 (available from Epoxy Technology, Inc.). In a preferred embodiment, a two-part epoxy resin is used as binder 206. Because of the limited shelf life of the epoxy resin, the two parts are mixed for 5 minutes at a temperature of 25° C. to 40° C. only 30 minutes to 2 hours before preparing slip mixture 202.

Preferably, the cure or set time for a thermosetting polymer used, for example, an epoxy polymer, is long enough to allow mixing of the slip mixture and casting into the mold before the thermosetting polymer hardens. For example, the set time is about 10 minutes to about 48 hours, preferably about 1 hour to about 3 hours.

The use of surfactants and dispersants in ceramics manufacturing is well known to one of ordinary skill in the art. Dispersants and surfactants, and optionally other additives, are used to control the stability, wettability, flowability, viscosity and other properties of the slip mixture. Any surfactant that is compatible with organic polymers can be used. Preferably, the surfactant lowers the surface tension of the polymer and is capable of stabilizing the slip mixture and/or facilitating the formation and molding of the slip mixture. Specific examples of surfactants for use in the present invention include, but are not limited to, Dow Corning 57 surfactant, Fluorad™ FC-4430 surfactant, Fluorad™ FC-4432 surfactant, Surfonic PE-1198 surfactant and KEN-REACT® KR-55 surfactant.

Any dispersant capable of facilitating the dispersion of the ceramic powder into the slip mixture and/or facilitating the formation and molding of the slip mixture can be used in the present invention. Specific examples of dispersants suitable for use in the present invention include, but are not limited to, DYSPERBYK® 110 dispersant and Dequest 2010 dispersant.

Upon formation, slip mixture 202 of the present invention comprises high vol. % and/or wt. % of ceramic powder, and preferably, comprises no excess liquid and no solvent. Slip mixtures of the present invention are pourable and flowable, having viscosities low enough for slip casting. Slip mixture 202 should have a viscosity of 2000 cPs to 3000 cPs. Because the slip mixtures comprise little to no excess solvent or liquid that requires evaporation to harden the slip, slip mixtures of the present invention have little to substantially no shrinkage upon setting in the mold.

In step 102, slip mixture 202 is prepared by combining ceramic powder 204, binder 206, surfactant 208 and optional dispersant 210 and mixing using any method known to one of ordinary skill in the relevant art. For example, slip mixture 202 can be mixed using a milling mixer, shaker mixer, shear mixer, kinetic shear mixer. The mixture is optionally held under a vacuum during mixing to remove any trapped gases in the slip mixture. For instance, the slip mixture can be inserted into and mixed in a kinetic shear mixer under vacuum. The mixture is mixed for a time sufficient to produce a fully mixed slip mixture with little to no agglomeration, and the mixing is stopped before the mixture sets and the polymer binder hardens. Preferably, the slip mixture is mixed under vacuum for a time of about 5 minutes to 1 hour at 400 rpm at room temperature.

Optionally, in one embodiment, the slip mixture is degassed prior to casting into a mold. In a preferred embodiment, the slip mixture is degassed in a vacuum chamber for 10 minutes at $5 \times 10^{-1}$ torr.

In step 104, slip mixture 202 is cast into a mold. Any method known to one of ordinary skill in the art can be used to transfer the slip into the mold such as slip casting and injection molding, or any other suitable technique for forming a ceramic body.

The mold can be of any suitable geometric shape. The mold may be circular, square, or any other suitable geometry for a ceramic body for a piezoelectric composite. In a preferred embodiment, the mold is circular in shape with a diameter range from about 2" to about 4" and is of sufficient depth to form a green body with a thickness of about 2.5 mm to 3 mm.

In another embodiment, the mold may be square to form green bodies having dimensions of 0.25 inches to 12 inches in both width and length.

Figure 3A:
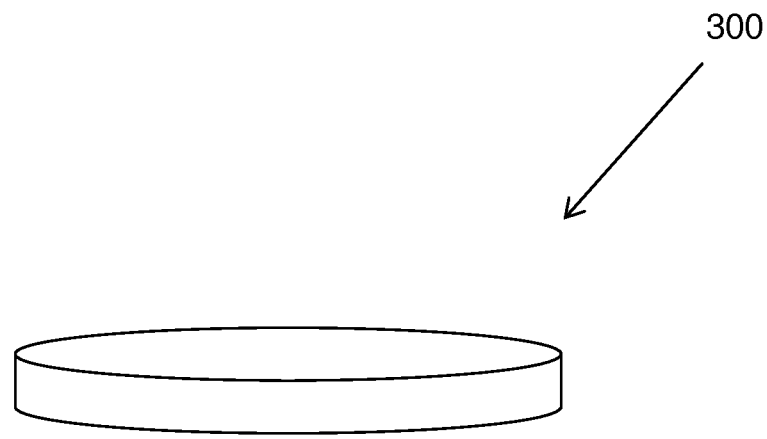
FIG. 3A shows an illustration of a circular-shaped green body separated from a mold according to an embodiment of the present invention.
Figure 3B:
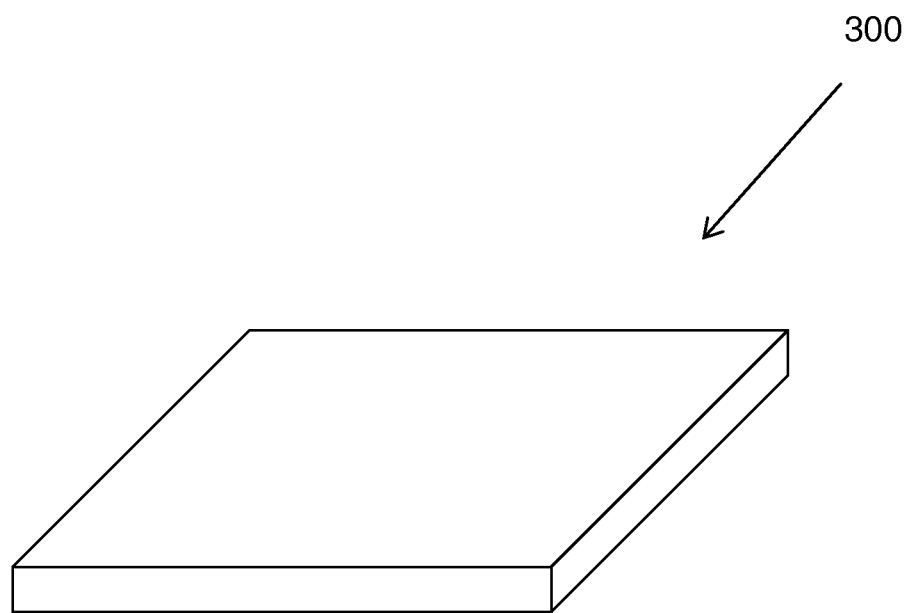
FIG. 3B shows an illustration of a rectangular-shaped green body separated from a mold according to an embodiment of the present invention.

In step 106, slip mixture 202 is set (cured) in the mold to form a green body. In one embodiment, the slip in the mold can be optionally degassed before setting/curing to form the green body. Slip 202 in the mold is degassed to reduce/avoid air pockets (voids) in the green body. The slip and mold can be in a vacuum chamber at $1.2 \times 10^{-1}$ torr for a time ranging from 30 minutes to one hour. In step 108, the slip should be set/cured for a sufficient time at a sufficient temperature so that the slip forms a green body 300 that is firm enough to separate from the mold but not brittle, as seen in FIGS. 3A and 3B. The green body 300 should have enough mechanical strength to be cut (diced) without fracturing green body 300. In a preferred embodiment, the slip is set in the mold by curing for approximately 24 hours in an oven at 120° C.

In step 110, the green body is cut (or diced) to form a cut green body with an array of a plurality of micron-sized ceramic elements (pillars) with micron-sized gaps/separations between the elements. In one embodiment, the green body can optionally be ground to a uniform thickness before dicing. The green body can be cut/diced using any suitable dicing method known to one of ordinary skill in the art. For example, the green body can be diced using a conventional dicing machine in conventional orientations. In one embodiment, green body 300 is diced by a dicing machine with a wafer saw.

One advantage of dicing a green body is that the green body can be diced at a rate 25 times to 50 times faster than conventional dicing of a sintered ceramic body. For example, in a typical dice and fill method the sintered ceramic body can be diced at a rate of 3 μm/sec to 5 μm/sec. In contrast, in the present invention, the green body can be diced at a rate of 150 μm/sec to 300 μm/sec. This faster rate substantially reduces the time and cost for manufacturing a ceramic body for a piezoelectric composite for a device, for example a transducer or sensor. For example, a transducer or sensor produced in accordance with the present invention costs about 2.2 cents per ceramic element/pillar to produce in comparison to a cost of 25 cents per ceramic pillar for traditional dicing methods. Additionally, dicing a green body is not as destructive to the blades of the dicing machine and prolongs the lifetime use of the blades.

Figure 4:
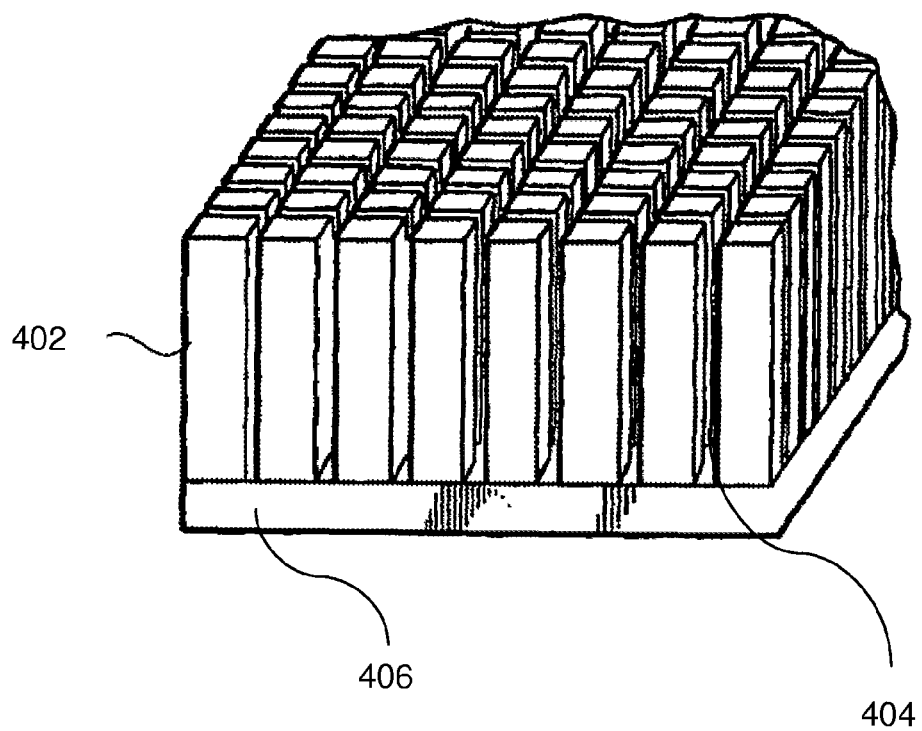
FIG. 4 shows an illustration of an array of a plurality micron-sized ceramic elements with kerfs (separations between elements), according to an embodiment of the present invention.

As seen in FIG. 4, the green body is cut (diced) to form cut green body 400 with an array comprising a plurality of ceramic elements (pillars) 402 separated by kerf (pillar-to-pillar separation) 404 supported by base 406. In one embodiment, ceramic elements 402 can range in size from 150 μm to 325 μm in height, from 35 μm to 65 μm in width, with kerf 402 of less than 25 μm. In a preferred embodiment, ceramic elements 402 have a height of 250 μm, width of 60 μm, and kerf 404 of 20 μm.

In step 112, diced green body 400 is sintered to form a sintered ceramic body. During the sintering step, it is critical to control shrinkage and warpage, so that the sintered ceramic body can be further processed efficiently and effectively. For example, spatial temperature gradients present during sintering can cause non-uniform shrinkage such that the kerf size varies across the ceramic body. Additionally, warpage can occur such that the ends of cut green body 400 curl during sintering so that its base 406 is no longer a flat surface. Controlling the temperature distribution during heat-up and cool-down phases is crucial to controlling shrinkage and warpage. Also, having a high solids loading in the slip mixture aids in controlling shrinkage.

In one embodiment, diced green body 400 undergoes a separate bisquing treatment to remove (burn out) the polymer binder before sintering. Diced green body 400 is heated in a kiln at sufficient temperature for a sufficient time to burn out the polymer binder. Controlling the temperature during the bisquing treatment is critical to burning out all of the polymers in the green body while preventing the green body from cracking. By way of example, the diced green body is heated to a temperature ranging from 300° C. to 750° C. Diced green body 400 undergoes a slow bisquing treatment over a 64 hour period up to a maximum temperature of 750° C. before cooling down. Diced green body 400 soaks (held at) 750° C. for 2 hours before cooling down. The slow bisque allows for removing the binder without deforming/distorting the diced ceramic body.

In step 112, the ceramic body is further heated (sintered) to form a densified sintered ceramic body. In one embodiment, the binder removed body is sintered at a sufficient temperature for a sufficient time to densify the body to 97-99% of theoretical density. The body is heated at a temperature of about 750° C. to 1100° C. In a preferred embodiment, the ceramic body is heated over 48 hours up to a maximum temperature of 1060° C. and soaked (held at) the maximum temperature for 1.5 hours.

In another embodiment during sintering step 112, the ceramic body is elevated on a support plate with a similar coefficient of expansion to control shrinkage and placed in a kiln to achieve a more uniform temperature gradient above and below the ceramic body. Elevating the ceramic body allows for air flow above and below the ceramic body. For example, the ceramic body can be placed on a PZT plate and then into the kiln to undergo sintering step 112. In another embodiment, the ceramic body and PZT support plate can be placed in an aluminum crucible and placed in a kiln. The aluminum crucible can, optionally, also contain PZT powder. The PZT powder is used to control lead loss, which is paramount for achieving constant ceramic material properties throughout the ceramic body. By placing the ceramic body in an equilibrium lead atmosphere lead loss is reduced/avoid.

Figure 5:
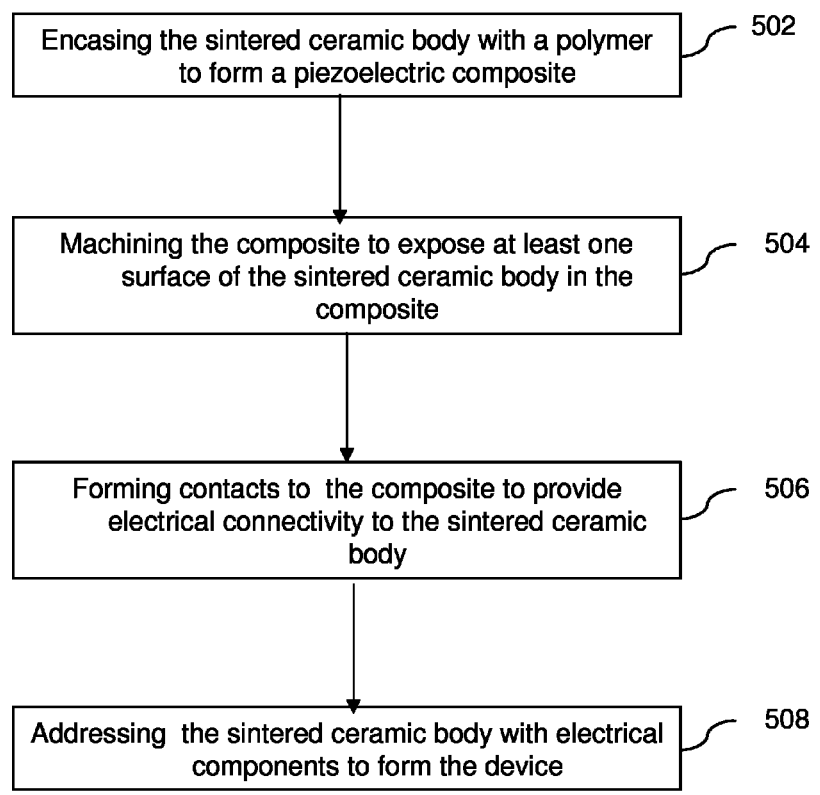
FIG. 5 shows a flowchart showing example steps for further processing a sintered ceramic body according to an embodiment of the present invention.
Figure 6:
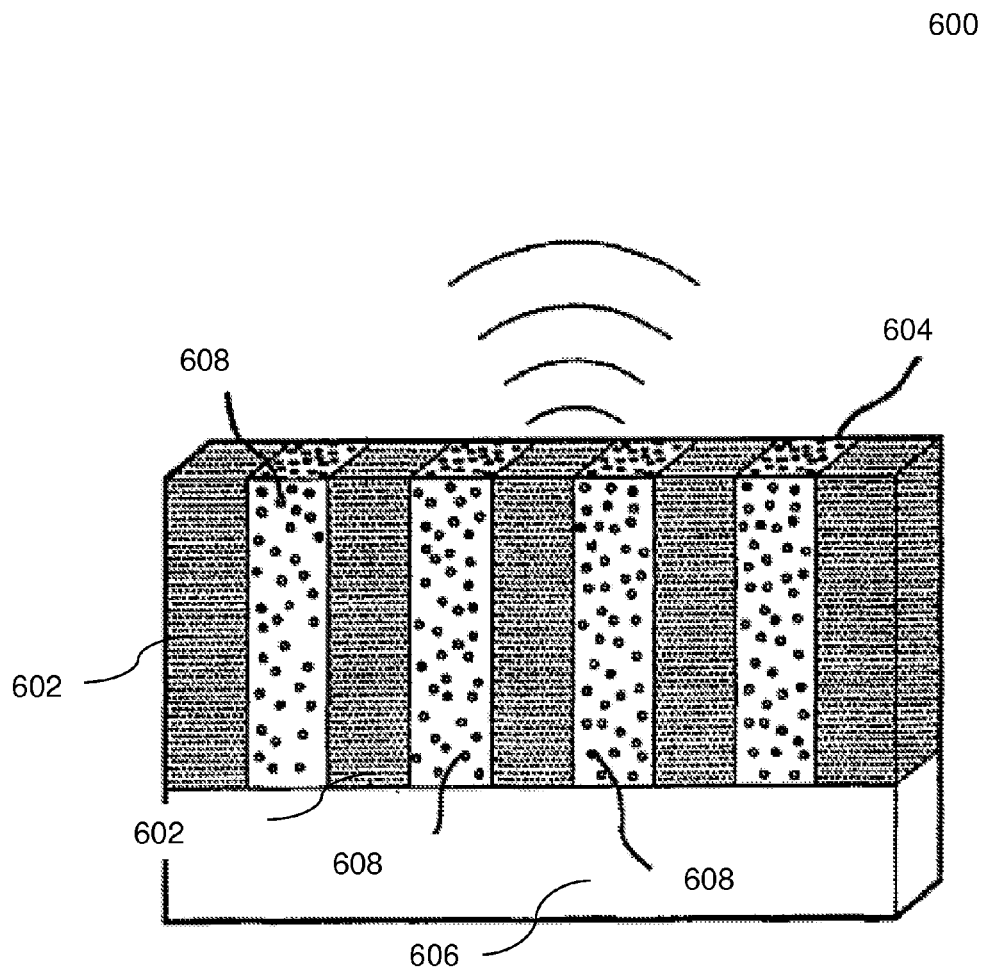
FIG. 6 shows an illustration of a row of ceramic elements having a polymer filler material between the elements according to an embodiment of the present invention.

The resulting sintered ceramic body can be further processed in a number of optional steps. FIG. 5 is an illustration of flowchart 500 showing example steps for further processing the sintered ceramic body to fabricate a piezoelectric composite and devices therefrom. In one embodiment the sintered ceramic body can be encased/encapsulated in a polymer to form a composite, as indicated in step 502. As shown in FIG. 6, kerfs 604 (the pillar to pillar separations) are filled with a polymer filler 608 to suppress any shear waves and give composite 600 improved mechanical characteristics. In order to optimize the sensitivity of a finished device, a polymer filler that provides high acoustical attenuation and electrical isolation should be used or any other suitable polymer filler material known to one skilled in the art.

In another embodiment, piezoelectric composite 600 can be further processed. In step 504, piezoelectric composite 600 is machined to expose at least one surface of the sintered ceramic body in the composite. In step 506, contacts are formed to the composite to provide electrical connectivity to the sinter ceramic pillars. In step 508 the sintered ceramic is addressed with electrical components to form a device. The micron-sized ceramic elements can be metallized and addressed to form a device, such as an acoustic transducer or sensor for obtaining biometric data and other types of information, such as medical information. The device is then polled by applying appropriate voltage at an appropriate temperature for an appropriate time. The parameter values vary due to the type of ceramic material used and thickness of the piezoelectric composite being processed.

Figure 7:
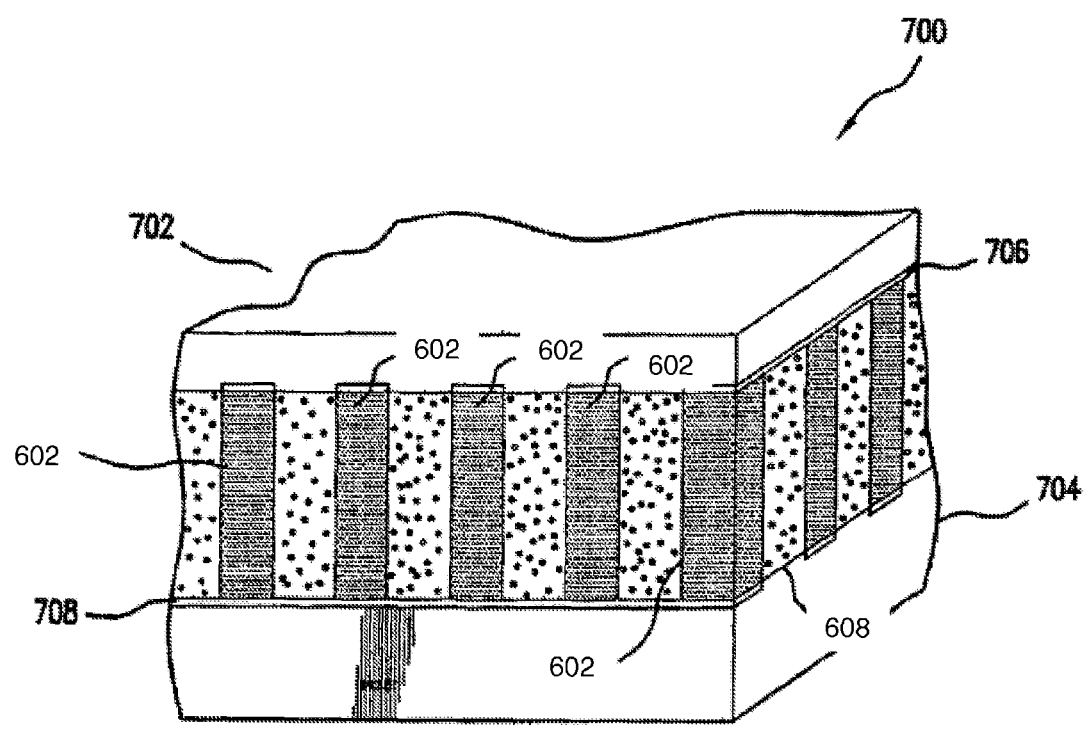
FIG. 7 shows an illustration of a sensor array according to an embodiment of the present invention.

FIG. 7 illustrates a device 700 fabricated in accordance with an embodiment of the present invention. Device 700 is a multilayer structure that includes a two dimensional array of ceramic pillars 602. Conductors 706 and 708 are connected to each of ceramic pillars 602. Conductors 706 connected to one end of each ceramic pillars 602 are oriented orthogonally with respect to conductors 708 connected to the another end of pillars 602. A shield layer 702 can be added to one side of device 700 to provide a protective coating where a finger can be placed proximate to device 700. A support 704 can be attached to the opposite end of device 700.

Figure 8:
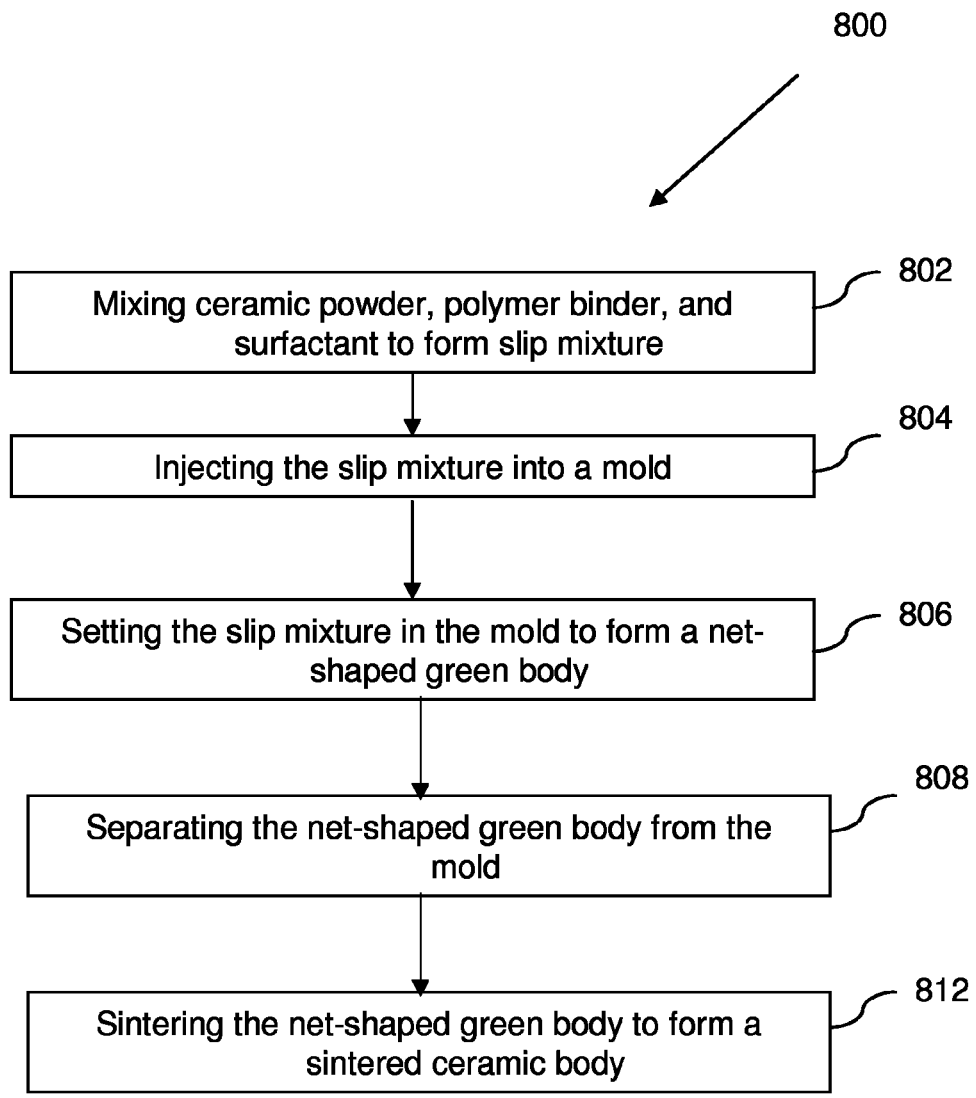
FIG. 8 shows a flowchart showing example steps for manufacturing a net-shaped sintered ceramic body according to an embodiment of the present invention.

In an alternative embodiment, slip mixture 202 can be injected into a precision mold to form a net-shaped green body with an array comprising a plurality of micron-sized ceramic elements and separations to eliminate the need for dicing the green body. FIG. 8 is an illustration of a flowchart 800 showing example steps for producing a net-shaped green body. "Net-shaped" is used herein to mean that green bodies of the present invention have high-quality, micron-sized ceramic elements upon setting in the mold, and no additional machining or processing is required to achieve high quality micron-sized ceramic elements.

Because the slip mixtures of the present invention have substantially no distortion upon setting, slip mixture 202 can be molded to a net-shaped green body. The phrase "substantially no distortion" is used herein to mean flat surfaces of the molded slip mixture remain flat upon setting/curing to form the green body, and the surfaces of the green body are smooth and essentially free of defects larger than about the grain size of the ceramic powder. Defects include, but are not limited to, holes, bubbles, cracks and the like. The slip mixtures, therefore, can be molded to net-shaped green bodies having high quality micron-sized ceramic elements, and the green bodies can have overall large dimensions.

Figure 9A:
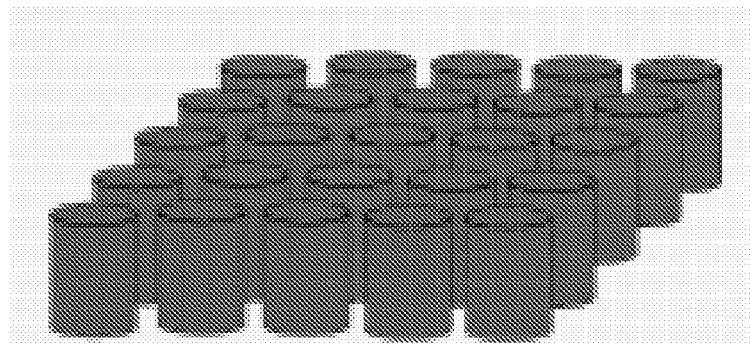
FIG. 9A shows an illustration of an array with uniform circular micron-sized ceramic elements in a net-shaped ceramic body.
Figure 9A:
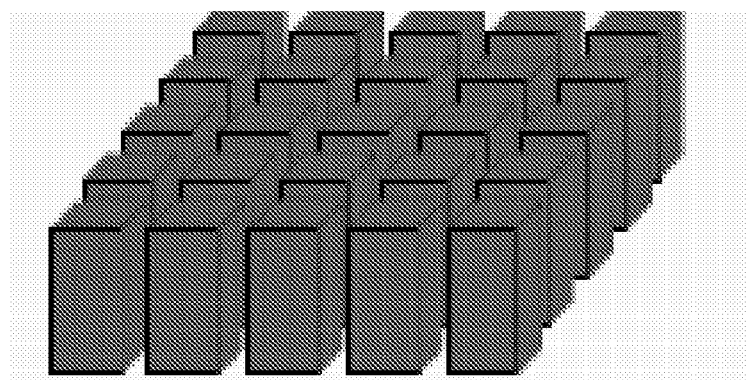
Figure 9C:
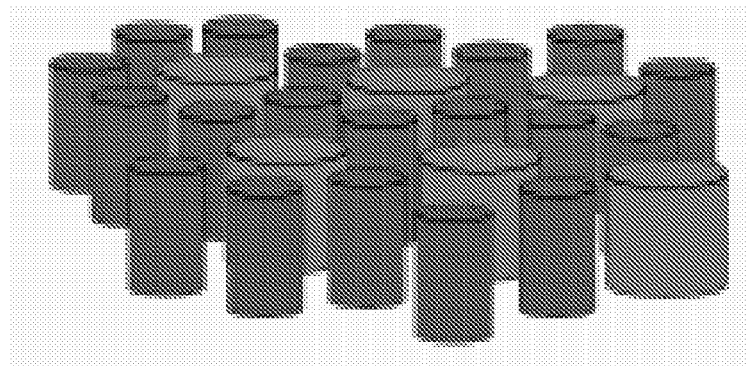
FIG. 9C shows an illustration of an array with various sized circular micron-sized ceramic elements in a net-shaped ceramic body.

Additionally, the net-shaped green bodies can be made in a wide range of geometries. For example, the micron-sized ceramic elements of the net-shaped green body can be uniform in size or vary in size and can be uniform in shape or vary in shape. By way of example, the micron-sized ceramic elements of the net-shaped green body can be circular, square and rectangular in shape. The net-shaped green bodies can also comprise micron-sized ceramic elements of one or more dimensional sizes. FIGS. 9A, 9B, and 9C illustrate some examples of the micron-sized ceramic elements geometries and arrangements that can be produced in accordance with an embodiment of the present invention.

In step 804, slip mixture 202 is injected into a mold and set in step 806 to form a net-shaped green body with an array comprising a plurality of micron-sized ceramic elements and separations. Slip mixture 202 can be injected into a mold using any method known to one of ordinary skill in the art for injecting or transferring the slip mixture into a mold. By way of example, slip mixture 202 can be injected into a mold using pressure. Pressures for use in step 804 include any pressure capable of injecting the slip mixture into the mold. In one embodiment, a pressure of about 5 p.s.i. to 100 p.s.i. at a temperature of about 20° C. to 40° C. is used. In a preferred embodiment, slip 202 is injected into a mold at a pressure ranging from 60 p.s.i. to 70 p.s.i.

The molds used for molding the slip mixture and setting to form a net-shaped green body can be any mold capable of forming and releasing micron-sized structural elements without damage. Examples of materials for use as molds include, but are not limited to, plastics and rubbers. Specific examples of materials include, but are not limited to, low durometer (hardness of less than about 40 A) theromset polyurethanes and silicones. In a preferred embodiment, the mold is made from a Room Temperature Vulcanization (RTV) silicone.

In step 806, slip mixture 202 is set in the mold to form a net-shaped green body with an array comprising a plurality of micron-sized ceramic elements and separations for a sufficient time at a sufficient temperature to be able to separate the green body from the mold without causing damage to the micron-sized ceramic elements. Any method known to one of ordinary skill in the art can be used to set the slip mixture. In a preferred embodiment, slip mixture 202 sets/cures in the mold at room temperature for a period ranging from 18 hours to 36 hours.

In step 808, the net-shaped green body is separated from the mold. Any method of separating known to one of ordinary skill in the art can be used to separate the net-shaped green body from the mold. Examples of methods include, but are not limited to, peeling or lifting the mold off the green bodies. Preferably, the separation is done so that few or none of the micron-sized ceramic elements are damaged during separation. Optionally, a mold release or release agent can be used to aid in separating the net-shaped green body from the mold without damage. The mold release or release agent can be applied directly to the mold prior to injecting slip mixture 202 into the mold.

After separating the net-shaped green body from the mold, it may undergo a similar bisquing treatment to remove (burn out) the polymer binder before sintering as described above. In step 812, the net-shaped green body can be similarly sintered to form a densified sintered net-shaped ceramic body.

The resulting sintered net-shaped ceramic body can be further processed as illustrated in FIG. 5 and described above to fabricate a piezoelectric composite and devices therefrom.

While various embodiments of the present invention have been described above, it should be understood that they have been presented by way of example only, and not limitation. It will be apparent to persons skilled in the relevant art that various changes in form and detail can be made therein without departing from the spirit and scope of the present invention. Thus, the breadth and scope of the present invention should not be limited by any of the above-described exemplary embodiments, but should be defined only in accordance with the following claims and their equivalents. All patents and publications discussed herein are incorporated in their entirety by reference thereto.

What is claimed is:

1. A method of manufacturing a piezoelectric ceramic body comprising:
   mixing a ceramic powder, polymer binder and surfactant to form a slip mixture with a solids loading by weight:
   casting said slip mixture into a mold;
   setting the slip mixture in said mold to form a green body
   separating said green body from said mold;
   cutting said green body to form a cut green body with an array comprising a plurality of micron-size ceramic elements and separations; and
   sintering said cut green body to form a densified sintered body.

2. The method of claim 1, wherein said ceramic powder comprises at least 90% of the slip mixture by weight percent.

3. The method of claim 1, wherein said ceramic powder comprises at least 95% of the slip mixture by volume percent.

4. The method of claim 1, further comprising grinding said ceramic powder so that said ceramic powder has a particle size range from 0.2 .mu.m to 1.6 .mu.m after said grinding.

5. The method of claim 1, wherein said ceramic powder is a piezoelectric or electrostrictive ceramic powder.

6. The method of claim 5, wherein said piezoelectric ceramic powder is selected from the group consisting of lead zirconate titanate (PZT), lead niobium titanate (PNT), lead scandium niobium titanate (PSNT), (PMN), lead titanate, and barium titanate.

7. The method of claim 1, wherein said polymer binder is an epoxy polymer.

8. The method of claim 7, wherein said epoxy polymer is a two-part epoxy resin.

9. The method of claim 1, wherein said slip further comprises a dispersant.

10. The method of claim 1, wherein said setting step comprises curing said slip mixture in said mold to a temperature of 100° C. to 140° C. for a sufficient time to form said green body.

11. The method of claim 1, wherein said cutting step comprises dicing said green body with a dicing machine.

12. The method of claim 1, wherein said micron-size ceramic elements have dimensions of 150 μm-325 μm in height, 35 μm-65 μm in width, and 25 μm-50 μm element-to-element separation.

13. The method of claim 1, wherein further comprising a bisquing treatment to remove said polymer binder from said cut green body, wherein said cut green body is heated to a sufficient temperature for a sufficient time to burn out said binder.

14. The method of claim 13, wherein said bisquing treatment further comprises heating said cut green body to a temperature between 60° C. to 750° C.

15. The method of claim 1, wherein said sintering step further comprises heating said body to a temperature between 1000° C. to 1100° C. for a time between 1 hour to 2 hours.

16. The method of claim 1, wherein said sintering step further comprises heating said body to a sufficient temperature for a sufficient time to densify said sintered ceramic body to at least 95% of the theoretical density.

17. The method of claim 1 further comprising the step of encasing said sintered ceramic body in a polymer material to fill said separations and form a ceramic-polymer composite.

18. The method of claim 1, wherein said micron-size ceramic elements have dimensions of 200 μm-300 μm in height, 50 μm-65 μm in width, and 20 μm-35 μm element-to-element separation.

19. A method of manufacturing a piezoelectric ceramic composite for a device, comprising: mixing a piezoelectric ceramic powder, organic binder, and surfactant to form a slip wherein said slip has a solids loading of at least 90% by weight; casting said slip into a mold to form a green body; separating said green body from said mold; cutting said green body to form a cut green body with an array of micron-sized ceramic elements and separations; bisquing said cut green body to burn out said organic binder; sintering said cut green body to form a sintered ceramic body; and encasing said sintered ceramic body in a polymer material to form a ceramic-polymer composite.

20. The method of claim 19, further comprising grinding said ceramic powder so that said ceramic powder has a particle size range from 0.2 .mu.m to 1.6 .mu.m after said grinding.

21. The method of claim 20, wherein said piezoelectric ceramic powder is selected from the group consisting of lead zirconate titanate (PZT), lead niobium titanate (PNT), lead scandium niobium titanate (PSNT), (PMN), lead titanate, and barium titanate.

22. The method of claim 19, wherein said polymer binder is a two-part epoxy resin.

23. The method of claim 19, wherein said slip further comprises a dispersant.

24. The method of claim 19, wherein said setting step comprises curing said slip mixture in said mold at temperature of 110° C. to 130° C. for time between 12 to 24 hours to form said green body.

25. The method of claim 19, wherein said bisquing step further comprises heating said cut green body to a temperature between 130° C. to 750° C. for a time between 60 hours to 68 hours.

26. The method of claim 19, wherein said sintering step further comprises heating said body to a temperature between 1000° C. to 1100° C. for a time between 1 hour to 2 hours.

27. The method of claim 19, wherein said sintering step further comprises heating said body to a sufficient temperature for a sufficient time to densify said sintered ceramic body to 97% to 99% of the theoretical density.

28. The method of claim 19 further comprising the step of machining said composite to expose at least one surface of said sintered ceramic body.

29. The method of claim 28 further comprising the step of forming contacts to said composite to provide electrical connectivity to the sintered ceramic body.

30. The method of claim 29 further comprising the step of addressing the sintered ceramic body with electrical components to form a device.

* * * * *